(12) United States Patent
Tamura et al.

(10) Patent No.: US 9,726,490 B2
(45) Date of Patent: Aug. 8, 2017

(54) ANGULAR VELOCITY SENSOR

(75) Inventors: Masahide Tamura, Toyama (JP);
Osamu Kawasaki, Toyama (JP);
Takayuki Nakano, Toyama (JP);
Shouhei Niikawa, Toyama (JP);
Hidekazu Yano, Toyama (JP); Tetsuji Imamura, Toyama (JP)

(73) Assignee: HOKURIKU ELECTRIC INDUSTRY CO., LTD., Toyama-shi (JP)

( * ) Notice: Subject to any disclaimer, the term of this patent is extended or adjusted under 35 U.S.C. 154(b) by 476 days.

(21) Appl. No.: 14/241,950

(22) PCT Filed: Sep. 3, 2012

(86) PCT No.: PCT/JP2012/072308
§ 371 (c)(1),
(2), (4) Date: Apr. 26, 2014

(87) PCT Pub. No.: WO2013/032003
PCT Pub. Date: Mar. 7, 2013

(65) Prior Publication Data
US 2014/0224015 A1    Aug. 14, 2014

(30) Foreign Application Priority Data

Sep. 2, 2011  (JP) ................. 2011-192127

(51) Int. Cl.
*G01C 19/56*  (2012.01)
*G01P 15/12*  (2006.01)
(Continued)

(52) U.S. Cl.
CPC ......... *G01C 19/56* (2013.01); *G01C 19/5733* (2013.01); *G01P 15/12* (2013.01);
(Continued)

(58) Field of Classification Search
CPC ......... G01C 19/56; G01P 15/09; G01P 15/14; G01P 15/12; G01P 15/08; G01P 15/18
(Continued)

(56) References Cited

U.S. PATENT DOCUMENTS 5,537,882 A * 7/1996 Ugai ..................... G01L 9/0054
338/42
5,567,880 A * 10/1996 Yokota .................. G01P 15/123
257/E27.006

(Continued)

FOREIGN PATENT DOCUMENTS

JP  8-145683  6/1996
JP  08-327657  12/1996
(Continued)

OTHER PUBLICATIONS

Japanese Office Action dated Nov. 9, 2015.
Japanese Office Action dated May 12, 2016.

*Primary Examiner* — Helen Kwok
(74) *Attorney, Agent, or Firm* — Rankin, Hill & Clark LLP

(57) ABSTRACT

Provided herein is a vibration-type angular velocity sensor capable of improving detection precision of angular velocities around the Z axis and preventing detection precision of angular velocities around the X and Y axes from deteriorating. A weight 3 is columnar or conic. The outline of an outer peripheral portion of a diaphragm 1 has such shape that a straight portion ST is formed at each of four corner portions of a square. Four vibration exciting electrodes 11 are respectively located in four regions partitioned by a first imaginary line L1 and a second imaginary line L2. Four angular velocity sensing electrodes 13 are respectively located in four regions partitioned by a first imaginary diagonal line CL1 and a second imaginary diagonal line Cl2.

12 Claims, 11 Drawing Sheets

(51) Int. Cl.
  *G01P 15/18* (2013.01)
  *H01L 41/047* (2006.01)
  *H01L 41/08* (2006.01)
  *G01C 19/5733* (2012.01)
  *H01L 41/09* (2006.01)
  *H01L 41/113* (2006.01)

(52) U.S. Cl.
  CPC ............ *G01P 15/18* (2013.01); *H01L 41/047* (2013.01); *H01L 41/0475* (2013.01); *H01L 41/0805* (2013.01); *H01L 41/0973* (2013.01); *H01L 41/1132* (2013.01)

(58) Field of Classification Search
  USPC .............. 73/504.12, 504.13, 504.04, 514.33, 73/514.34
  See application file for complete search history.

(56) References Cited

U.S. PATENT DOCUMENTS

| | | | | |
|---|---|---|---|---|
| 5,691,471 | A * | 11/1997 | Okazaki | G01C 19/56 73/504.03 |
| 5,866,817 | A * | 2/1999 | Mori | G01P 15/123 73/514.33 |
| 6,321,600 | B1 * | 11/2001 | Hirose | G01P 15/0922 73/514.01 |
| 6,946,695 | B2 * | 9/2005 | Schiller | G01C 19/56 257/226 |
| 7,367,232 | B2 * | 5/2008 | Vaganov | G01P 15/123 73/514.33 |
| 7,500,406 | B2 * | 3/2009 | Morimoto | G01L 5/161 257/419 |
| 7,882,740 | B2 * | 2/2011 | Okada | G01C 19/56 73/511 |
| 8,508,105 | B2 * | 8/2013 | Kang | G01C 19/56 310/329 |
| 8,850,888 | B2 * | 10/2014 | Lim | G01C 19/56 73/504.12 |
| 9,052,195 | B2 * | 6/2015 | Noh | G01C 19/56 |
| 2004/0221651 | A1 * | 11/2004 | Schiller | G01C 19/56 73/514.34 |
| 2006/0032307 | A1 | 2/2006 | Schiller | |
| 2008/0034867 | A1 * | 2/2008 | Kazama | G01P 1/023 73/514.34 |
| 2008/0210008 | A1 * | 9/2008 | Okada | G01C 19/56 73/514.16 |
| 2010/0064804 | A1 * | 3/2010 | Kawakubo | G01C 19/56 73/504.03 |
| 2012/0152020 | A1 * | 6/2012 | Kim | G01P 15/09 73/514.32 |
| 2012/0297874 | A1 * | 11/2012 | Kim | G01C 19/56 73/504.12 |
| 2013/0125652 | A1 * | 5/2013 | Kim | G01P 15/09 73/514.34 |
| 2013/0133426 | A1 * | 5/2013 | Park | G01P 15/12 73/514.33 |
| 2013/0152687 | A1 * | 6/2013 | Han | G01P 15/0922 73/514.34 |

FOREIGN PATENT DOCUMENTS

| | | | |
|---|---|---|---|
| JP | 2000-304544 | | 11/2000 |
| JP | 2001-156348 | | 6/2001 |
| JP | 2010-043929 | | 2/2010 |
| JP | 2010-122141 | | 6/2010 |
| JP | 2010-160095 | | 7/2010 |
| JP | 2010-185739 | * | 8/2010 |

\* cited by examiner

ANGULAR VELOCITY SENSOR

TECHNICAL FIELD

The present invention relates to an angular velocity sensor.

BACKGROUND ART

FIGS. 1A to 1C are a plan view, a cross sectional view, and a bottom view of a conventional angular velocity sensor, respectively, as shown in JP2010-160095A (Patent Document 1). This angular velocity sensor includes a flat plate-like diaphragm 101, a weight 103 located at a central portion of the diaphragm 101, a support portion 105 configured to support an outer peripheral portion of the diaphragm 101, an underlying electrode 107 formed on a surface of the diaphragm via an insulating film 106, a piezoelectric film 109 formed on the underlying electrode, and four vibration exciting electrodes 111 and four angular velocity detecting electrodes 113, both of which are formed on the piezoelectric film. To excite vibration having a motion component oriented in a predetermined direction of axis of vibration with respect to the weight 103, a vibration exciting portion composed of the four vibration exciting electrodes 111 is driven or excited. Displacement in a direction of axis of displacement of the weight 103 caused based on the Coriolis force is detected by the four angular velocity detecting electrodes 113 to obtain an angular velocity. In this angular velocity sensor, an origin O is defined to be located at the center position of the diaphragm 101 and an XYZ three-dimensional orthogonal coordinate system is defined such that the surface of the diaphragm 101 is included in an XY plane. Further, one of the X and Z axes is defined as the axis of vibration and the other as the axis of displacement. Then, an angular velocity around the Y axis is detected based on values detected by the four angular velocity electrodes 113 which define a displacement detecting portion. To detect angular velocities around the X and Y axes, the weight 103 should be vibrated in the Z-axis direction. To detect an angular velocity around the Z axis, the weight 103 should be vibrated in the X-axis or Y-axis direction.

PRIOR ART DOCUMENT

Patent Document

Patent Document 1: JP2010-160095A

SUMMARY OF INVENTION

Technical Problem

In the conventional angular velocity sensor, the cross sectional shape of the weight 103 is circular and the outline shape of the outer peripheral portion of the diaphragm 101 is also circular. In such configuration, it is not possible to fully vibrate the weight 103 in the X-axis or Y-axis direction although an attempt is made to vibrate the weight 103 in order to detect an angular velocity around the Z axis. Actually, the weight 103 is diagonally vibrated due to the shape of electrodes formed on the surface of the diaphragm 101, and the working precision of the weight 103 and the support portion 105, thereby making it difficult to precisely detect an angular velocity around the Z axis. In other words, the vibration-type angular velocity sensor as described in Patent Document 1 cannot fully distinguishably identify driving vibrations and detected vibrations when detecting an angular velocity around the Z axis, thereby suffering difficulties in attaining sufficiently precise detection of angular velocities.

An object of the present invention is to provide a vibration-type angular velocity sensor capable of improving detection precision of angular velocities around the Z axis and preventing detection precision of angular velocities around the X and Y axes from deteriorating.

Solution to Problem

An angular velocity sensor of the present invention comprises a flat plate-like diaphragm, a weight disposed at a central portion of the diaphragm, a support portion configured to support an outer peripheral portion of the diaphragm, and a vibration exciting portion and an displacement detecting portion, both of which are disposed at the diaphragm. The vibration exciting portion is operable to excite vibration having a motion component oriented in a predetermined axis of vibration with respect to the weight. The displacement detecting portion is operable to detect displacement of the weight caused based on the Coriolis force in a direction of axis of displacement. When defining a XYZ three-dimensional orthogonal coordinate system such that an origin is located at a center position of the diaphragm and a surface of the diaphragm is included in an XY plane, one of the X and Z axes is the axis of vibration and the other is the axis of displacement, and an angular velocity around the Y axis is detected based on a detection value detected by the displacement detecting portion.

Particularly in the present invention, the weight is columnar or conic in shape, and an outline shape of the outer peripheral portion has a straight portion or a curved portion located at each of four corner portions of a quadrangle. The term "columnar" or "conic" which identifies the shape of the weight not only refers to a complete column or a complete cone in a geometric sense but also to allow for the presence of distortion and asperity or surface irregularity (concavity and convexity) caused during manufacturing process as well as a portion having a radius radially increasing that is formed at boundary portions (corner portions) between the weight and the diaphragm. Likewise, the straight and curved portions included in the outline shape of the outer peripheral portion of the diaphragm are not limited to geometrically complete straight and curved shapes.

According to the present invention, vibrations in the X-axis and Y-axis directions are clear as required for detecting an angular velocity around the Z axis. Further, vibrations in the Z-axis direction is not deteriorated as required for detecting angular velocities around the X-axis and Y-axis directions. Thus, the present invention provides an angular velocity sensor capable of sufficiently vibrating the weight in the X-axis or Y-axis direction in order to detect an angular velocity around the Z axis. Further, the present invention provides an angular velocity sensor capable of improving sensing precision for angular velocities around the Z axis and preventing deterioration of sensing precision of angular velocities around the X and Y axes.

The inventors studied vibrations in three axial directions, namely, the X, Y, and Z axes when the outline shape of the outer peripheral portion of the diaphragm is varied in respect of a particular shape of the weight, specifically, the columnar or conic weight. Then, they found the following relationships.

When the outline shape of the outer peripheral portion of the diaphragm is circular, vibrations occurring in the Z-axis direction are good, but it is hard to distinguishably identify vibrations occurring in the X-axis and Y-axis directions from each other.

When the outline shape of the outer peripheral portion of the diaphragm is quadrangular, it is easy to distinguishably identify vibrations occurring in the X-axis and Y-axis directions, but vibrations occurring in the Z-axis direction are likely to be distorted.

Then, the inventors formulated the outline shapes of the outer peripheral portion of the diaphragm as intermediate shapes between the circular and quadrangular shapes, and conducted various tests. They found that when the outline shape of the outer peripheral portion of the diaphragm is any one of the intermediate shapes according to the present invention, it is easy to distinguishably identify vibrations occurring in the X-axis and Y-axis directions from each other and displacement of the diaphragm depicts concentric circles as vibrations occur in the Z-axis direction, thereby stabilizing driving vibrations.

The vibration exciting portion and the displacement detection portion each include a plurality of electrodes. It has been well known that detection performance is affected by the shape and arrangement of the electrodes. For this reason, preferred shapes and arrangement of the electrodes should be appropriately determined according to the target performance. Specifically, the angular velocity sensor of the present invention may include an underlying electrode formed on the surface of the diaphragm; a piezoelectric film formed on the underlying electrode; four vibration exciting electrodes formed on the piezoelectric film to define the vibration exciting portion; and four angular velocity sensing electrodes formed on the piezoelectric film to be located inwardly of the four vibration exciting electrodes and to define the displacement detecting portion. In this configuration, a first imaginary line, a second imaginary line, a first imaginary diagonal line, and a second imaginary diagonal line are assumed as follows. The first imaginary line is orthogonal to two opposed sides of the diaphragm and divides the two opposed sides in half. The second imaginary line is orthogonal to two remaining opposed sides of the diaphragm and divides the two remaining opposed sides in half. The first imaginary diagonal line passes through the center of two opposed corner portions of the diaphragm and the second imaginary diagonal line passes through the center of two remaining opposed corner portions. In addition, the outline shape of the outer peripheral portion of the diaphragm is axisymmetric with respect to the first or second imaginary line. In this configuration, the four vibration exciting electrodes are respectively located in four regions partitioned by the first and second imaginary lines, or in four regions partitioned by the first and second imaginary diagonal lines. The four angular velocity sensing electrodes are respectively located in four regions partitioned by the first and second imaginary lines, or in four regions partitioned by the first and second imaginary diagonal lines. With such arrangement of the electrodes, signals capable of distinguishing vibrations occurring in the X-axis and Y-axis directions from each other can reliably be obtained from the four angular velocity sensing electrodes.

When the diaphragm, the weight, and the support portions are unitarily formed by etching a semiconductor substrate, the following arrangement is preferred in order to obtain signals capable of furthermore clearly distinguish the vibrations occurring in the X-axis and Y-axis directions. The four vibration exciting electrodes are respectively located in four regions partitioned by the first and second imaginary lines. Also, the four angular velocity sensing electrodes are respectively located in four regions partitioned by the first and second imaginary lines. Preferably, in this configuration, the first and second imaginary diagonal lines respectively coincide with axial lines of the X and Y axes.

In another specific arrangement, the four vibration exciting electrodes may be respectively located in four regions partitioned by the first and second imaginary diagonal lines. The four angular velocity sensing electrodes may be respectively located in four regions partitioned by the first and second imaginary diagonal lines. In this arrangement, the first and second imaginary lines respectively coincide with axial lines of the X and Y axes. Here, a length dimension of the outline shape of the diaphragm along the second imaginary line is defined as R1, a length dimension of the outline shape of the diaphragm along the first imaginary line is defined as R2, and a length dimension of the outline shape of the diaphragm along the second imaginary diagonal lines is defined as R3. If R1, R2, and R3 satisfy a relationship of R1:R2:R3=(a value in the range of 0.95 plus or minus 0.02):1:(a value in the range of 0.85 plus or minus 0.02), both the detection sensitivity around the primary axis and the detection sensitivity around other axes are well balanced.

Preferably, the four vibration exciting electrodes and the four angular velocity sensing electrodes are located not to extend over a boundary between the diaphragm and the weight and a boundary between the diaphragm and the support portion. With this arrangement, vibration can efficiently be excited and vibrations in the X-axis and Y-axis directions can be increased.

Preferably, the four vibration exciting electrodes and the four angular velocity sensing electrodes are respectively arranged to be axisymmetric with respect to the first and second imaginary lines. With this arrangement, it is possible to obtain signals capable of more clearly distinguish the vibrations in the X-axis and Y-axis directions from each other.

When the four vibration exciting electrodes each have an outline shape formed by an outer side located radially outwardly of the weight, an inner side radially opposed to the outer side, and a pair of connecting sides connecting the outer and inner sides, the outer side preferably has a shape similar to that of a part of the outer peripheral portion of the diaphragm. With this configuration, vibration can more efficiently be excited.

In the above-mentioned configuration, it is preferable that the inner side has a shape similar to that of the outer side. With this configuration, vibration can most efficiently be excited.

When the four angular velocity sensing electrodes each have an outline shape formed by an outer side located radially outwardly of the weight, an inner side radially opposed to the outer side, and a pair of connecting sides connecting the outer and inner sides, it is preferred that the outer side and the inner side are concentrically arc-like in shape. If such angular velocity sensing electrodes are used, signals capable of distinguishing vibrations in the X-axis and Y-axis directions from each other and having large amplitude in an available range can be output from the four angular velocity sensing electrodes.

Preferably, the outline shape of the diaphragm has curved connecting portions each connecting the sides and the corner portions. With this configuration, the diaphragm can mechanically be strengthened. Also, the outline shape of each of the four vibration exciting electrodes preferably has curved corner portions. Further, the outline shape of each of the four angular velocity sensing electrodes preferably has curved corner portions. With this configuration, the electrodes can be prevented from peeling off.

DESCRIPTION OF EMBODIMENTS

Figure 1A:
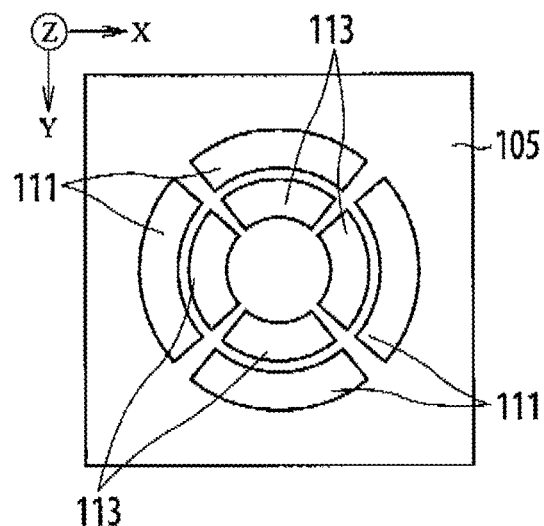
FIGS. 1A, 1B, and 1C are respectively a plan view, a cross sectional view, and a bottom view of a conventional angular velocity sensor.
Figure 1B:
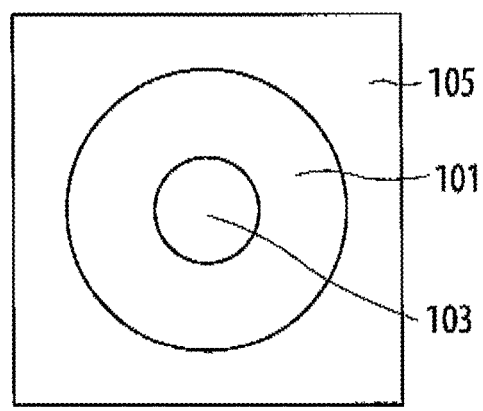
Figure 1C:
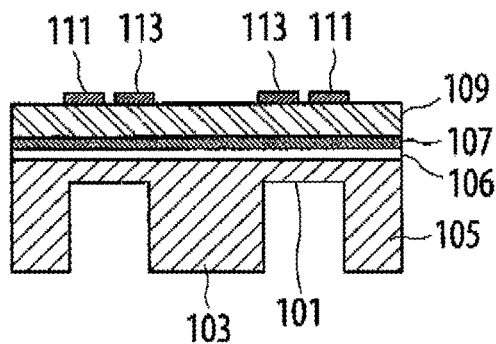
Figure 2A:
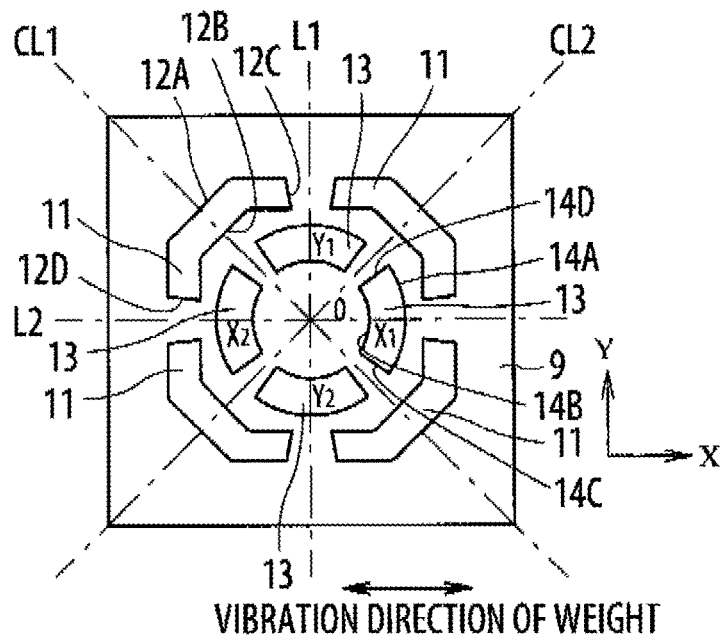
FIGS. 2A and 2B are respectively a plan view and a bottom view of an angular velocity sensor according to an embodiment or a first embodiment of the present invention.
Figure 2B:
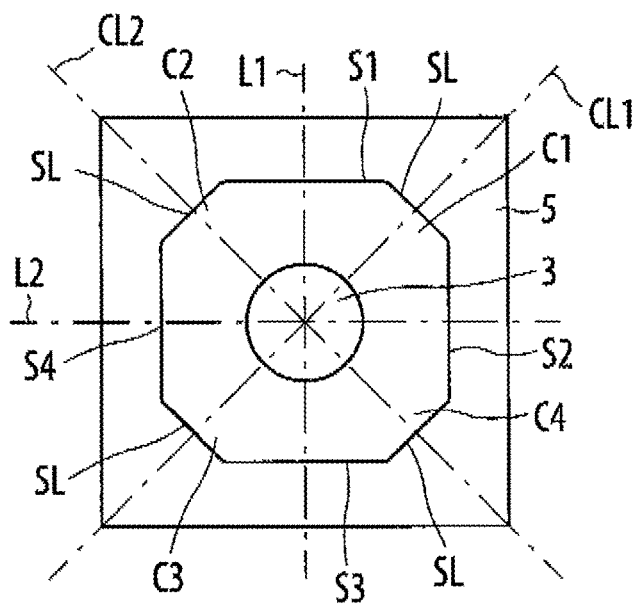

Now, embodiments of the present invention will be described below with reference to the drawings. FIGS. 2A and 2B are respectively a plan view and a bottom view of an angular velocity sensor according to an embodiment or a first embodiment of the present invention. A cross sectional view of the angular velocity sensor of this embodiment is omitted since it is the same as that of the conventional angular velocity sensor of FIG. 1B. Also, a wiring pattern is omitted from FIG. 2A. The angular velocity sensor of this embodiment includes a flat plate-like diaphragm 1, a weight 3 disposed at the central portion of the diaphragm 1, a support portion 5 configured to support the outer peripheral portion of the diaphragm 1, an underlying electrode, not shown, formed on the surface of the diaphragm 1 via an insulating film, not shown, a piezoelectric film 9 formed on the underlying electrode, four vibration exciting electrodes 11 formed on the piezoelectric film 9, and four angular velocity sensing electrodes 13 also formed on the piezoelectric film 9. The diaphragm 1 and the weight 3, and the support portion 5 are unitarily formed by disposing a mask, which has a shape corresponding to an end face of the weight 3 and an end face of the support portion 5, on one of the surfaces of a semiconductor substrate having crystal orientation (100) and performing dry etching from the mask side. In this embodiment, the four vibration exciting electrodes 11 define a vibration exciting portion operable to excite vibration having a motion component oriented in a predetermined axis of vibration with respect to the weight. The four angular velocity sensing electrodes 13 define a displacement detecting portion operable to detect displacement of the weight caused based on the Coriolis force in a direction of axis of displacement.

The weight 3 is columnar or conic in shape. The outer peripheral portion of the diaphragm has such outline shape that a straight portion ST is located at each of four corner portions of a quadrangle (generally a square in this embodiment). In this embodiment, a small curved portion is formed at each intersection of the sides S1-S4 of the square and the straight portions ST.

In this embodiment, when defining a XYZ three-dimensional orthogonal coordinate system such that an origin O is located at a center position of the diaphragm 1 and a surface of the diaphragm 1 is included in an XY plane, an X axis and a Y axis are defined as shown in FIG. 2A. Here, a first imaginary line L1 is assumed as being orthogonal to two opposed sides S1 and S3 of the diaphragm 1 and dividing the two sides S1 and S3 in half, a second imaginary line L2 as being orthogonal to two remaining opposed sides S2 and S4 of the diaphragm 1 and dividing the two remaining sides S2 and S4 in half, a first imaginary diagonal line CL1 as passing through the center of two opposed corner portions C1 and C3 of the diaphragm 1 and a second imaginary diagonal line CL2 as passing through the center of two remaining opposed corner portions C2 and C4. Then, an outline shape of the outer peripheral portion of the diaphragm 1 is defined as being axisymmetric with respect to the first imaginary line L1 or the second imaginary line L2. In this embodiment, the four vibration exciting electrodes 11 are respectively located in four regions partitioned by the first and second imaginary lines L1 and L2. Further, the four angular velocity sensing electrodes 13 are respectively located in four regions partitioned by the first and second imaginary diagonal lines Cl1 and CL2.

The four vibration exciting electrodes 11 each have an outline shape formed by an outer side 12A located radially outwardly of the weight 3, an inner side 12B radially opposed to the outer side 12A, and a pair of connecting sides 12C and 12D connecting the outer side 12A and the inner side 12B. The outer side 12A has a shape similar to that of a part of the outer peripheral portion of the diaphragm 1, namely, a portion extending over a part of adjacent two sides and the straight portion. Further, the inner side 12B of the outline of each vibration exciting electrode 11 has a shape similar to that of the outer side. With such shape of the vibration exciting electrodes 11, vibration can be excited efficiently.

The four angular velocity sensing electrodes 13 each have an outline shape farmed by an outer side 14A located radially outwardly of the weight 3, an inner side 14B radially opposed to the outer side 14A, and a pair of connecting sides 14C and 14D connecting the outer side 14A and the inner side 14B. In this embodiment, the outer side 14A and the inner side 14B are concentrically arc-like in shape. With such shapes of the four vibration exciting electrodes 11 and the four angular velocity sensing electrodes 13, signals capable of distinguishing vibrations in the X-axis direction and Y-axis directions from each other can reliably be obtained from the four angular velocity sensing electrodes 13.

In this embodiment, the four vibration exciting electrodes 11 and the four angular velocity sensing electrodes 13 are located not to extend over a boundary between the diaphragm 1 and the weight 3 and a boundary between the diaphragm 1 and the support portion 5. With this arrangement of the four vibration exciting electrodes 11 and the four angular velocity sensing electrodes 13, the amplitude of output signals from the four angular velocity sensing electrodes 13 can furthermore be increased.

To excite vibration having a motion component oriented in a predetermined direction of axis of vibration with respect to the weight 3, the vibration exciting portion composed of the four vibration exciting electrodes 11 is driven or excited. Displacement in a direction of axis of displacement of the weight 3 caused based on the Coriolis force is detected by the four angular velocity detecting electrodes 13 to obtain an angular velocity. In this angular velocity sensor, one of the X and Z axes is the axis of vibration and the other is the axis of displacement. Then, an angular velocity around the Y axis is detected based on a detection value detected by the angular velocity sensing electrodes 13 forming the displacement detecting portion. To detect angular velocities around the X and Y axes, the weight 3 should be vibrated in the Z-axis direction. In this embodiment, the vibrations in the X-axis and Y-axis directions required to detect the angular velocities around the Z-axis are clearly identified. Further, the vibrations in the Z-axis direction required to detect the angular velocities around the X-axis and Y-axis are not deteriorated. Thus, this embodiment attains an angular velocity sensor capable of detecting the Coriolis force and sufficiently vibrating the weight in the X-axis or Y-axis direction in order to detect an angular velocity around the Z axis. To detect an angular velocity around in the Z-axis, the weight 3 should be vibrated in the X-axis or Y-axis direction.

Figure 3:
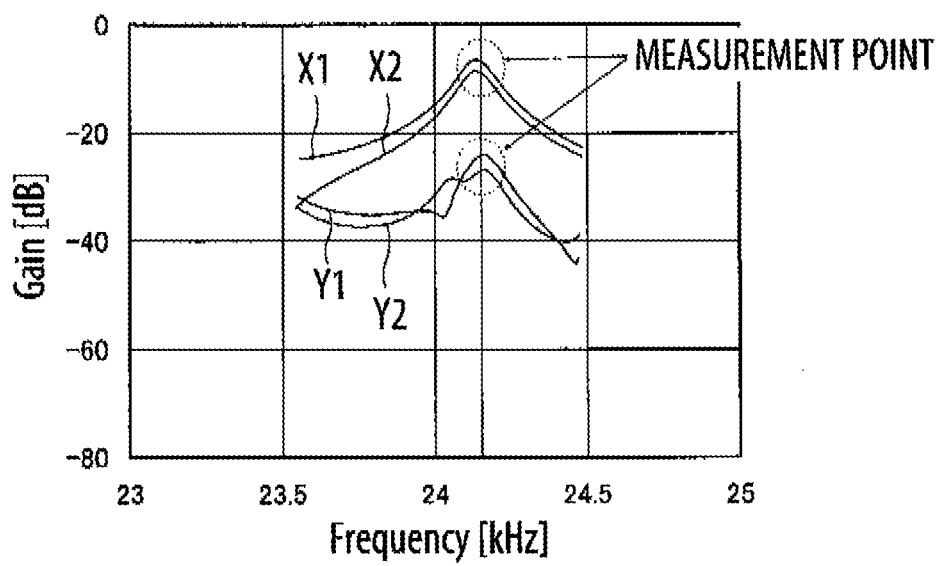
FIG. 3 partially shows an output in a predetermined frequency range as obtained from four angular velocity sensing electrodes when the electrode exciting electrodes are driven or excited to cause the weight to vibrate in the X-axis direction in the above embodiment.

FIG. 3 partially shows an output in a predetermined frequency range as obtained from the four angular velocity sensing electrodes 13 when the electrode exciting electrodes 11 are driven or excited to cause the weight 3 to vibrate in the X-axis direction with a frequency of 24.2 kHz in the angular velocity sensor of this embodiment. Reference signs X1, X2, Y1, and Y2 of FIG. 3 are the same as X1, X2, Y1, and Y2 of FIG. 2A used to identify the electrodes. It can be known from FIG. 3 that an output capable of clearly identifying the vibrations in the X-axis and Y-axis directions can be obtained.

Figure 4A:
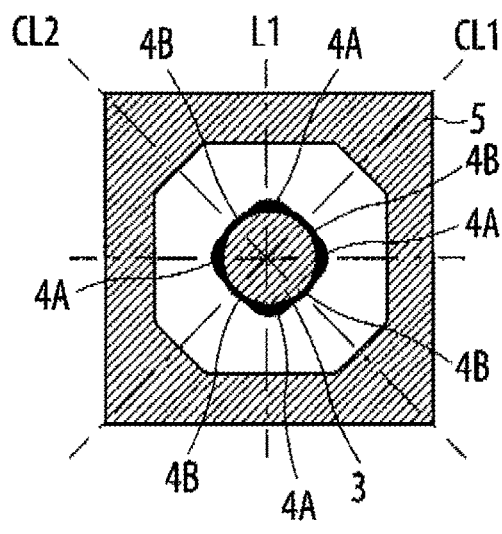
FIGS. 4A and 4B are used to explain how skirt portions (unetched portions which are not etched) are formed in the course of dry etching a semiconductor substrate.
Figure 4B:
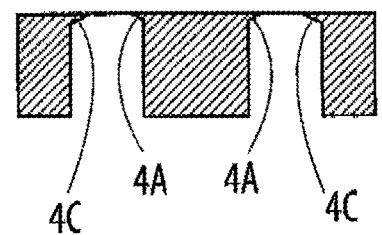

The diaphragm 1, the weight 3, and the support portion 5 are unitarily formed by dry etching a semiconductor substrate having crystal orientation (100). As shown in FIGS. 4A and 4B, skirt portions (unetched portions which are not etched) 4A-4C remain in a boundary portion between the support portion 5 and the diaphragm 1 and a boundary portion between the weight 3 and the diaphragm 1. Especially, the skirt portions (unetched portions) remaining between the weight 3 and the diaphragm 1 each have a certain orientation. As shown in FIG. 4A, it has been found that the maximum length of the skirt portions (unetched portions) 4A extending along the first and second imaginary lines L1 and L2 is longer than the maximum length of the skirt portions (unetched portions) 4B extending along the first and second imaginary diagonal lines CL1 and CL2. The presence of the longer skirt portions (unetched portions) 4A gives not a little effect to the vibration characteristics.

Figure 5:
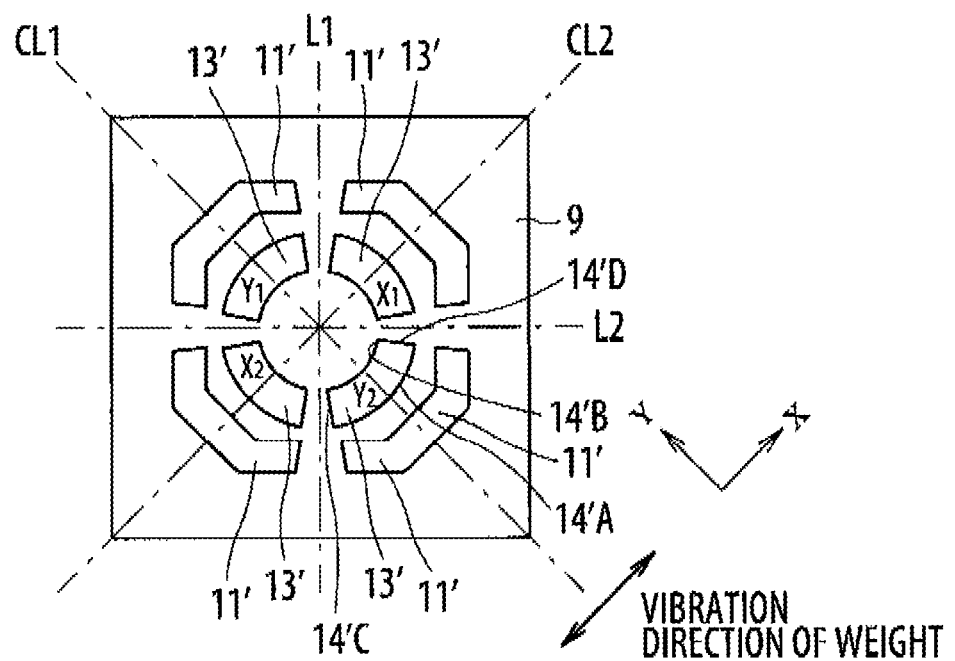
FIG. 5 is a plan view of an angular velocity sensor according to another embodiment or a second embodiment of the present invention.

FIG. 5 is a plan view of an angular velocity sensor according to a second embodiment of the present invention which aims at solving the above-mentioned technical issue. In this embodiment, four vibration exciting electrodes 11' are respectively located in four regions partitioned by the first and second imaginary lines L1 and L2. Four angular velocity sensing electrodes 13' are also respectively located in four regions partitioned by the first and second imaginary lines L1 and L2. In this arrangement, the first and second imaginary diagonal lines CL1 and CL2 respectively coincide with axial lines of the X and Y axes. In this embodiment, the effect due to the presence of the longer skirt portions (unetched portions) is reduced by defining the X-axis and Y-axis coordinates in directions in which the shorter skirt portions (unetched portions) 4B are formed.

Figure 6:
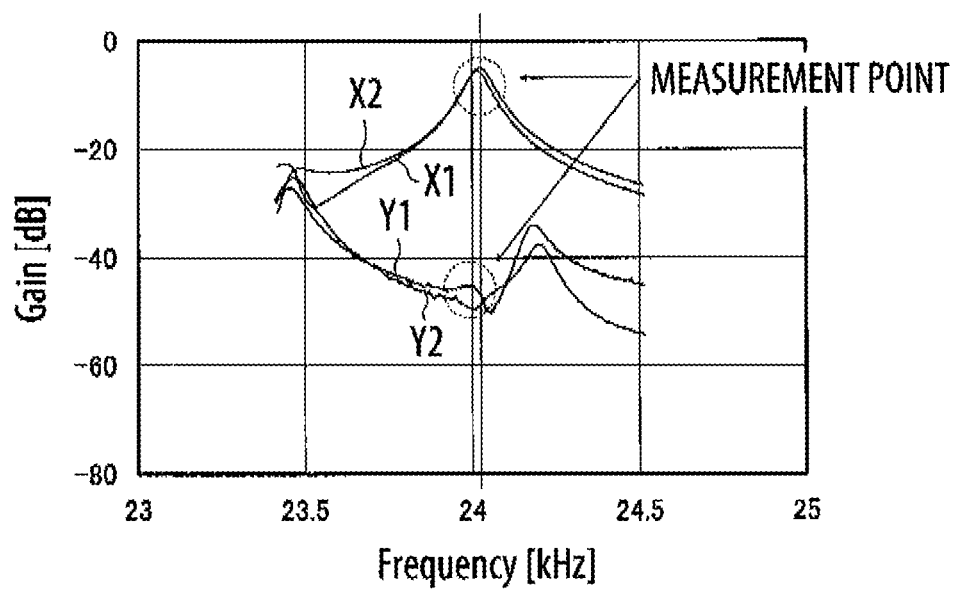
FIG. 6 partially shows an output in a predetermined frequency range as obtained from four angular velocity sensing electrodes when the electrode exciting electrodes are driven or excited to cause the weight to vibrate in the x-axis direction in the embodiment of FIG. 5.

FIG. 6 partially shows en output in a predetermined frequency range as obtained from the four angular velocity sensing electrodes 13' when the electrode exciting electrodes 11' are driven or excited to cause the weight 3 to vibrate in the X-axis direction with a frequency of 24.0 kHz in the angular velocity sensor of this embodiment. Reference signs X1, X2, Y1, and Y2 of FIG. 6 are the same as X1, X2, Y1, and Y2 of FIG. 5 used to identify the electrodes. It can be known by comparing FIG. 6 with FIG. 3 that a difference between the outputs (X1, X2) in the X-axis direction and the outputs (Y1, Y2) in the Y-axis direction is larger in this embodiment than in the embodiment of FIG. 3. Compared with the embodiment of FIG. 2, the embodiment of FIG. 5 attains clearer identification of vibrations in the X-axis and Y-axis directions. Of course, different arrangements of electrodes having a different shape from that of this embodiment may be employed according to the characteristics of diaphragm material used.

Figure 7A:
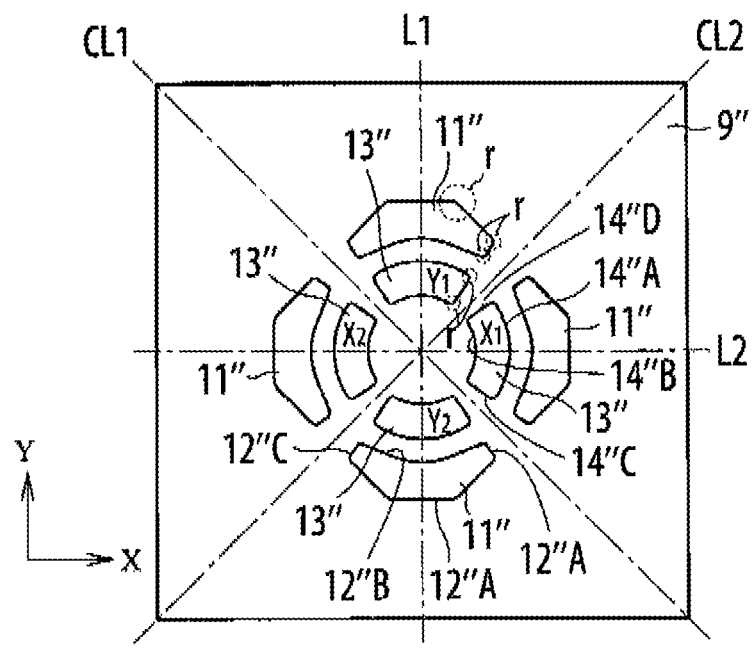
FIGS. 7A and 7B are respectively a plan view and a rear view of an angular velocity sensor according to a third embodiment of the present invention.
Figure 7B:
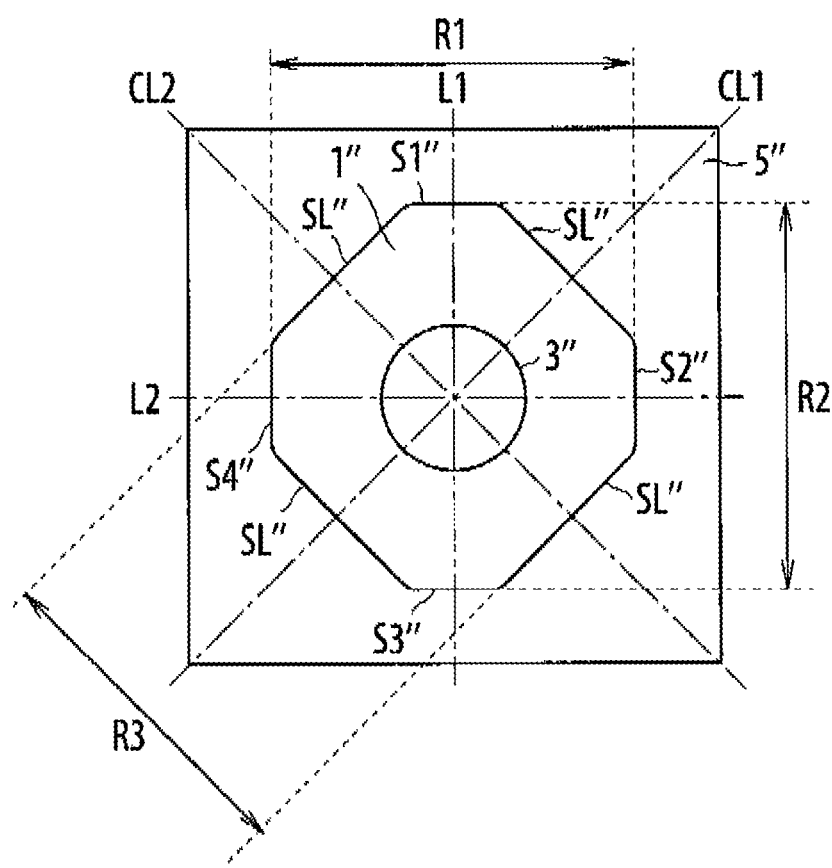

FIGS. 7A and 7B are respectively a plan view and a rear view of an angular velocity sensor according to a third embodiment of the present invention. In this embodiment, four vibration exciting electrodes 11" are respectively located in four regions partitioned by the first and second imaginary diagonal lines CL1 and Cl2. Four angular velocity sensing electrodes 13" are also respectively located in four regions partitioned by the first and second imaginary diagonal lines Cl1 and Cl2. In this embodiment, the first and second imaginary lines L1 and L2 respectively coincide with axial lines of the X and Y axes. In such arrangement, a length dimension of the outline shape of the diaphragm along the second imaginary line is defined as R1, a length dimension of the outline shape of the diaphragm along the first imaginary line as R2, and a length dimension of the outline shape of the diaphragm along the second imaginary diagonal lines as R3. It has been confirmed by experiments that both the detection sensitivity around the primary axis and the detection sensitivity around other axes can be balanced if R1, R2, and R3 satisfy a relationship of R1:R2:R3=(a value in the range of 0.95 plus or minus 0.02):1:(a value in the range of 0.85 plus or minus 0.02). In this embodiment, the four vibration exciting electrodes 11" each have an outline shape formed by an outer side 12"A located radially outwardly of the weight 3", an inner side 12"B radially opposed to the outer side 12"A, and a pair of connecting sides 12"C and 12"D connecting the outer and inner sides 12"A and 12"B. The outer side 12"A has a shape similar to that of a part of the outer peripheral portion of the diaphragm 1", namely, a portion extending over a part of adjacent two sides SL" and the straight portion S1". Further, the inner side 12"B of the outline shape of each vibration exciting electrode 11" has an arc-like shape. With such shape of the four vibration exciting electrodes 11", vibration can be excited most efficiently. Further, the four angular velocity sensing electrodes 13" each have an outline shape formed by an outer side 14"A located radially outwardly of the weight 3", an inner side 14"B radially opposed to the outer side 14"A, and a pair of connecting sides 14"C and 14"D connecting the outer and inner sides 14"A and 14"B. In this embodiment, the outer side 14"A and the inner side 14"B are concentrically arc-like in shape. With such shapes of the four vibration exciting electrodes 11" and the four angular velocity sensing electrodes 13", signals capable of distinguishing vibrations in the X-axis direction and vibrations in the Y-axis direction can reliably be obtained from the four angular velocity sensing electrodes 13". In this embodiment, each of the four vibration exciting electrodes 11" and each of the four angular velocity sensing electrodes 13" are shaped such that they have curved corner portions as indicated with "r" in FIG. 7A. This effectively prevents peel-off of the electrodes. Further in this embodiment, the outline shape of the diaphragm 1" has curved connecting portions connecting the sides and the corner portions as indicated with "r" in FIG. 7A. This helps increase the mechanical strength of the diaphragm 1".

Figure 8A:
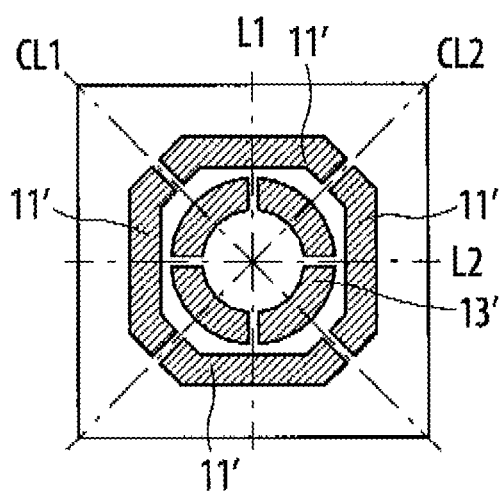
FIGS. 8A through 8D show various shapes and arrangements of the electrodes.
Figure 8B:
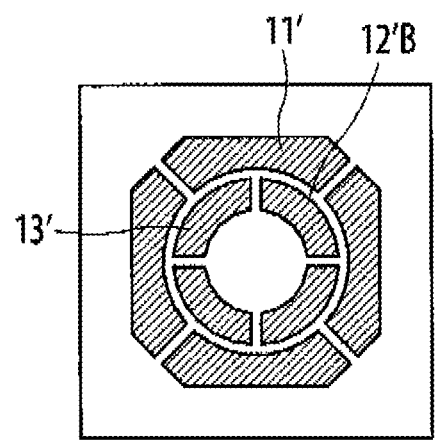
Figure 8C:
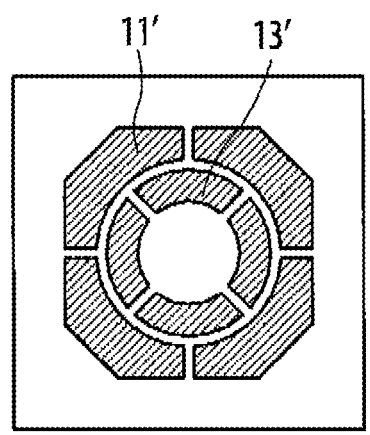
Figure 8D:
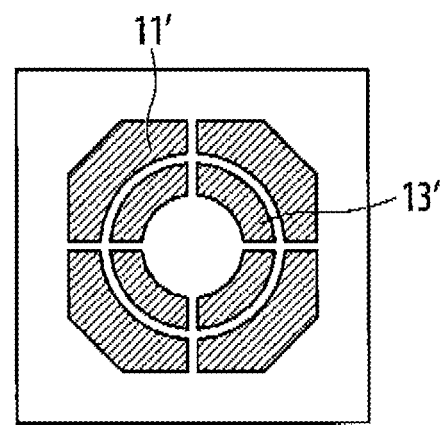

In an embodiment of FIG. 8A, four vibration exciting electrodes 11' are respectively located in four regions partitioned by the first and second imaginary diagonal lines CL1 and CL2. Four angular velocity sensing electrodes 13' are respectively located in four regions partitioned by the first and second imaginary lines L1 and L2. In an embodiment of FIG. 8B, the arrangement of the electrodes is the same as that of the embodiment of FIG. 8A, but the inner side 12'B of the vibration exciting electrode 11' has an arc-like shape. In an embodiment of FIG. 8C, the inner side 12'B of the vibration exciting electrode 11' has an arc-like shape as with the embodiment of FIG. 8B, and the arrangement of the electrodes is the same as the embodiment of FIG. 2A. Further in an embodiment of FIG. 8D, the inner side 12'B of the vibration exciting electrode 11' has an arc-like shape as with the embodiment of FIG. 8B, and the arrangement of the electrodes is the same as the embodiment of FIG. 5.

Figure 9:
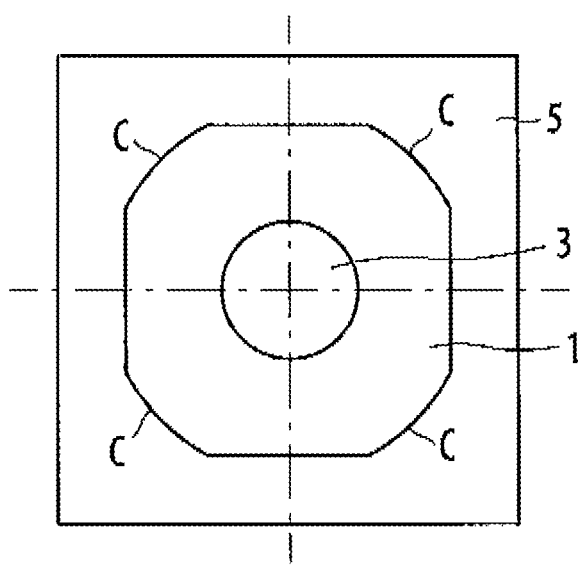
FIG. 9 shows a diaphragm having a different outline shape.

In the above-mentioned embodiments, the outer peripheral portion of the diaphragm has such outline shape that a straight portion is located at each of four corner portions of a quadrangle, specifically generally a square. As shown in FIG. 9, however, the outer peripheral portion of the diaphragm may have such outline shape that a curved portion C is located at each of four corner portions of a square. Also in this case, the same effect is obtainable as with the embodiment in which a straight portion is located at each of four corner portions of the square.

INDUSTRIAL APPLICABILITY

According to the present invention, clear vibrations can be excited in the X-axis and Y-axis directions as required for detecting an angular velocity around the Z axis. Further, vibrations in the Z axial direction required for detecting angular velocities around X and Y axes are not deteriorated. Therefore, the angular velocity sensor of the present invention can improve precision of detecting an angular velocity around the Z axis, and prevent precision of detecting angular velocities around the X and Y axes from being deteriorated.

DESCRIPTION OF REFERENCE SIGNS 1 diaphragm
3 weight
5 support portion
9 piezoelectric film
11 vibration exciting electrode
12A outer side
12B inner side
12C connecting side
angular velocity detecting electrode
14A outer side
14B inner side
14C connecting side
L1 first imaginary line
L2 second imaginary line
CL2 second imaginary diagonal line
CL1 first imaginary diagonal line

The invention claimed is:
1. An angular velocity sensor comprising:
a flat plate-like diaphragm including a central portion and an outer peripheral portion;
a weight disposed at the central portion of the diaphragm;
a support portion configured to support the outer peripheral portion of the diaphragm;
a vibration exciting portion operable to excite vibration having a motion component oriented in a predetermined axis of vibration with respect to the weight; and
a displacement detecting portion operable to detect displacement of the weight caused based on a Coriolis force in a direction of axis of displacement, wherein:
defining a XYZ three-dimensional orthogonal coordinate system such that an origin is located at a center position of the diaphragm and a surface of the diaphragm is included in an XY plane, one of the X and Z axes is the axis of vibration and the other is the axis of displacement, and an angular velocity around the Y axis is detected based on a detection value detected by the displacement detecting portion;
the weight is columnar or conic in shape;
the diaphragm, the weight, and the support portion are unitarily formed;
the diaphragm has such an outline shape that an outline shape of the outer peripheral portion has a straight portion or a curved portion located at each of four corner portions of a quadrangle; and,
the angular velocity sensor further comprises:
an underlying electrode formed on the surface of the diaphragm;
a piezoelectric film formed on the underlying electrode;
four vibration exciting electrodes formed on the piezoelectric film to define the vibration exciting portion; and
four angular velocity sensing electrodes formed on the piezoelectric film to be located inwardly of the four vibration exciting electrodes and to define the displacement detecting portion, wherein:
assuming a first imaginary line as being orthogonal to two opposed sides of the diaphragm and dividing the two opposed sides in half, a second imaginary line as being orthogonal to two remaining opposed sides of the diaphragm and dividing the two remaining opposed sides in half, a first imaginary diagonal line as passing through the center of two opposed corner portions of the diaphragm and a second imaginary diagonal line as passing through the center of two remaining opposed corner portions, the outline shape of the outer peripheral portion of the diaphragm is axisymmetric with respect to the first or second imaginary line;
the four vibration exciting electrodes are respectively located in four regions partitioned by the first and second imaginary lines, or in four regions partitioned by the first and second imaginary diagonal lines;
the four angular velocity sensing electrodes are respectively located in four regions partitioned by the first and second imaginary lines, or in four regions partitioned by the first and second imaginary diagonal lines;
the outline shape of each of the four vibration exciting electrodes has curved corner portions; and
the outline shape of each of the four angular velocity sensing electrodes has curved corner portions.

2. The angular velocity sensor according to claim 1, wherein the quadrangle is generally a square.

3. The angular velocity sensor according to claim 1, wherein:
the diaphragm, the weight, and the support portion are unitarily formed by etching a semiconductor substrate;
the four vibration exciting electrodes are respectively located in four regions partitioned by the first and second imaginary lines;
the four angular velocity sensing electrodes are respectively located in four regions partitioned by the first and second imaginary lines; and
the first and second imaginary diagonal lines respectively coincide with axial lines of the X and Y axes.

4. The angular velocity sensor according to claim 1, wherein the four vibration exciting electrodes and the four angular velocity sensing electrodes are respectively arranged to be axisymmetric with respect to the first and second imaginary lines.

5. The angular velocity sensor according to claim 1, wherein:
the diaphragm, the weight, and the support portion are unitarily formed by etching a semiconductor substrate;
the four vibration exciting electrodes are respectively located in four regions partitioned by the first and second imaginary diagonal lines;
the four angular velocity sensing electrodes are respectively located in four regions partitioned by the first and second imaginary diagonal lines;
the first and second imaginary lines respectively coincide with axial lines of the X and Y axes; and
defining a length dimension of the outline shape of the diaphragm along the second imaginary line as R1, a length dimension of the outline shape of the diaphragm along the first imaginary line as R2, and a length dimension of the outline shape of the diaphragm along the second imaginary diagonal lines as R3, wherein R1, R2, and R3 satisfy a relationship of R1:R2:R3=(a value in the range of 0.95 plus or minus 0.02):1:(a value in the range of 0.85 plus or minus 0.02).

6. The angular velocity sensor according to claim 3, wherein the four vibration exciting electrodes and the four angular velocity sensing electrodes are located not to extend over a boundary between the diaphragm and the weight and a boundary between the diaphragm and the support portion.

7. The angular velocity sensor according to claim 1, wherein:
the four vibration exciting electrodes each have an outline shape formed by an outer side located radially outwardly of the weight, an inner side radially opposed to the outer side, and a pair of connecting sides connecting the outer and inner sides; and
the outer side has a shape similar to that of a part of the outer peripheral portion of the diaphragm.

8. The angular velocity sensor according to claim 7, wherein the inner side has a shape similar to that of the outer side.

9. The angular velocity sensor according to claim 7, wherein the inner side has an arc-like shape.

10. The angular velocity sensor according to claim 1, wherein:
the four angular velocity sensing electrodes each have an outline shape formed by an outer side located radially outwardly of the weight, an inner side radially opposed to the outer side, and a pair of connecting sides connecting the outer and inner sides; and
the outer side and the inner side are concentrically arc-like in shape.

11. The angular velocity sensor according to claim 1, wherein the outline shape of the diaphragm has curved connecting portions each connecting the sides and the corner portions.

12. The angular velocity sensor according to claim 5, wherein the four vibration exciting electrodes and the four angular velocity sensing electrodes are located not to extend over a boundary between the diaphragm and the weight and a boundary between the diaphragm and the support portion.

* * * * *